(12) United States Patent
Tanaka et al.

(10) Patent No.: US 6,395,094 B1
(45) Date of Patent: May 28, 2002

(54) PROCESS SYSTEM WITH TRANSFER UNIT FOR OBJECT TO BE PROCESSED

(75) Inventors: Keiichi Tanaka, Nirasaki; Shinsuke Asao, Kosai-Machi; Masahito Ozawa, Yamanashi-ken; Masaki Sohma, Nirasaki, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/548,602

(22) Filed: Apr. 13, 2000

(30) Foreign Application Priority Data

Apr. 15, 1999 (JP) .......................................... 11-108612

(51) Int. Cl.[7] .......................... B65G 49/00; H01L 21/00
(52) U.S. Cl. ...................... 118/719; 414/217; 414/936; 414/939
(58) Field of Search .......................... 118/719; 414/936, 414/939, 217

(56) References Cited

U.S. PATENT DOCUMENTS

| | | | | |
|---|---|---|---|---|
| 4,917,556 A | * | 4/1990 | Stark | 414/217 |
| 4,990,047 A | * | 2/1991 | Wagner | 414/217 |
| 5,340,261 A | * | 8/1994 | Oosawa | 414/217 |
| 5,695,564 A | * | 12/1997 | Imahashi | 118/719 |
| 5,769,952 A | * | 6/1998 | Komino | 118/719 |
| 6,102,164 A | * | 8/2000 | McClintock | 187/267 |
| 6,143,083 A | * | 11/2000 | Yonemitsu | 118/719 |
| 6,183,564 B1 | * | 2/2001 | Reynolds | 118/719 |

FOREIGN PATENT DOCUMENTS

| | | |
|---|---|---|
| JP | 64-500072 | 1/1989 |
| JP | 7-93348 | 10/1995 |
| JP | 7-335711 | 12/1995 |
| JP | 2628335 | 4/1997 |

* cited by examiner

Primary Examiner—Richard Bueker
(74) Attorney, Agent, or Firm—Smith, Gambrell & Russell, LLP

(57) ABSTRACT

A process system comprises cassette housing chambers 33A and 33B, each of which houses therein a cassette C having housed an object W to be processed, and process chambers 26A through 26D for carrying out a predetermined process for the object W. The cassette housing chambers 30A and 30B are connected to the process chambers 26A through 26D via a transfer chamber 28. In the transfer chamber 28, there are provided a first transfer unit 32 for delivering the object W between the cassette housing chambers 30A and 30B and the transfer chambers 26A through 26D, and a second transfer unit 34 for delivering the object W between the process chambers 20A through 26D and the transfer chamber 28. In the overlapping range 36 of transfer ranges of the first and second transfer units 32 and 34, an aligning unit 38 for aligning the object W is arranged.

6 Claims, 9 Drawing Sheets

//PROCESS SYSTEM WITH TRANSFER UNIT FOR OBJECT TO BE PROCESSED

BACKGROUND OF THE INVENTION

1. Field of the Invention

The present invention relates generally to a process system, equipped with a transfer unit for an object to be processed, such as a semiconductor wafer, for carrying out a predetermined process for the object.

2. Description of the Related Art

In general, in order to produce a semiconductor integrated circuit, various processes, such as deposition, etching, oxidation and diffusion, are carried out for a wafer. In addition, in order to improve throughput and yields by the scale down and high integration of the semiconductor integrated circuit, a so-called clustered-process-system has been proposed. In such a process system, a plurality of process chambers for carrying out the same process or different processes are connected to each other via a transfer chamber so that processes in various processes can be sequentially carried out without the exposure of the wafer to the atmosphere.

FIG. 8 is a schematic diagram showing an example of such a conventional clustered-process-system. As shown in this figure, a process system 2 comprises three process chambers 4A, 4B and 4C, and two cassette housing chambers 12A and 12B. The process system 2 also comprises a first transfer chamber 10, a second transfer chamber 6 and two load-lock chambers 8A and 8B having a preheating or cooling mechanism.

The three process chambers 4A through 4C are connected to the second transfer chamber 6. The two load-lock chambers 8A and 8B are provided in parallel between the first and second transfer chambers 10 and 6. The two cassette housing chambers 12A and 12B are connected to the first transfer chamber 10. Between the respective chambers, gate valves G capable of being airtightly open and closed are provided.

First and second articulated transfer arms 16 and 14 capable of bending, stretching and rotating are provided in the first and second transfer chambers 10 and 6, respectively. By holding and transporting a semiconductor wafer W by these transfer arms 16 and 14, the semiconductor wafer W is transferred. In the first transfer chamber 10, an aligning unit 22 comprising a turntable 18 and an optical sensor 20 is provided. The aligning unit 22 is designed to rotate the wafer W, which is introduced from the cassette housing chamber 12A or 12B, to detect the orientation flat or notch of the wafer W to align the wafer W.

With respect to the process of the semiconductor wafer W, an unprocessed semiconductor wafer W is first taken out from a cassette in any one of the cassette housing chambers, e.g., a cassette C in the cassette housing chamber 12A, by means of the first transfer arm 16 in the first transfer chamber 10, which is held at atmospheric pressure in an atmosphere of $N_2$, to be mounted on the turntable 18 of the aligning mechanism 22 in the first transfer chamber 10. While the turntable 18 rotates to align the wafer W, the transfer arm 16 stands by without moving. The time required to carry out the alignment is, e.g., about 10 to 12 seconds.

After the alignment of the wafer W is completed, the standby transfer arm 16 holds the aligned wafer W again, and introduces the wafer W into any one of the load-lock chambers, e.g., the load-lock chamber 8A. In the load-lock chamber 8A, the wafer W is preheated if necessary, while the interior of the load-lock chamber 8A is evacuated to a predetermined pressure. The time required to carry out the preheating or evacuation is, e.g., about 30 to 40 seconds.

If such a preheating operation is completed, the load-lock chamber 8A is communicated with the second transfer chamber 6, which is previously held in a vacuum state, by opening the gate valve G. Then, the preheated wafer W is held by the second transfer arm 14 to be transferred into a predetermined process chamber, e.g., the process chamber 4A, in which a predetermined process, e.g., a process for depositing a metal film or insulating film, is carried out. The time required to carry out this process is, e.g., about 60 to 90 seconds.

The processed semiconductor wafer W is introduced into, e.g., the original cassette C in the cassette holding chamber 12A, along the reverse route of the above described route. In the route for returning the processed wafer W, the wafer W is transferred after being cooled to a predetermined temperature using, e.g., the other load-lock chamber 8B. The time to cool and return the wafer W to atmospheric pressure is about 30 to 40 seconds. Alternatively, before the processed wafer W is introduced into the cassette C, the wafer W may be aligned by the aligning mechanism 22 if necessary.

Furthermore, when the semiconductor wafer W is oxidized or diffused, there are some cases where it is not required to hold the transfer unit at a reduced pressure atmosphere. In that case, there are some cases where a buffer part capable of causing a plurality of wafers W to stand by for timing is provided in place of the load-lock chambers 8A and 8B capable of being evacuated.

By the way, in a process system of this type, in the above described case, the time required to treat a single wafer W is, e.g., about 60 to 90 seconds, which is some longer than the time required to carry out the alignment or preheating, although it depends on the contents of process. Therefore, the plurality of process chambers 4A through 4C are provided to effectively carry out operations. As a result, there is a problem in that the throughput of products is rate-controlled by the transfer time for the wafer W in the transfer unit. For example, during the introduction of the wafer W, until the alignment of the wafer W is completed after the wafer W is mounted on the turntable 18 of the aligning mechanism 22, the first transfer arm 16 stands by without moving and can not other transfer operations. In addition, after the alignment of the wafer W is completed, the first transfer arm 16 is monopolized to transfer the wafer W to the load-lock chamber 8A.

For such a reason, since the transfer arm is not efficiently used, there is a problem in that it is not possible to sufficiently improve throughput. In addition, since the number of delivery operations of the wafer is relatively large in the above described wafer transfer unit, aligning errors are accumulated every delivery operation, so that there is also a problem in that the final precision of the alignment deteriorates.

SUMMARY OF THE INVENTION

It is therefore an object of the present invention to eliminate the aforementioned problems and to provide a so-called cluster-tool-type process system capable of efficiently transferring an object to be processed, to improve the throughput in the process for the object and to improve the precision of the alignment for the object.

In order to accomplish the aforementioned and other objects, according to one aspect of the present invention, a process system comprises: a housing chamber for housing therein an object to be processed; a process chamber for carrying out a predetermined process for the object; a transfer chamber for establishing a communication between the housing chamber and the process chamber; a first transfer unit for delivering the object between the transfer chamber and the housing chamber; a second transfer unit for delivering the object between the transfer chamber and the process chamber; and an aligning unit for aligning the object, wherein the aligning unit is arranged in an overlapping range of transfer ranges of the first and second transfer units.

Thus, since the aligning unit is arranged in a transfer range common to the first and second transfer units, the second transfer unit can take the aligned object after the object is mounted on the aligning unit by the first transfer unit. Therefore, immediately after the first transfer unit mounts the object on the aligning unit, the first transfer unit can move to carry out the transfer operation of another object without standing by until the aligning operation is completed. As a result, it is possible to efficiently transfer the object, so that it is possible to improve the throughput in the process.

In addition, if it is not required to preheat the object in a buffer part, the aligned object can be introduced into the process chamber by a single delivery operation. Thus, it is possible to minimize aligning errors. In addition, since the object does not pass through the buffer part, it is possible to improve the transfer efficiency, so that it is possible to further improve the throughput.

The process system may further comprise a buffer part for temporarily holding the object, the buffer part being provided in the overlapping range. Thus, since the aligned object can be temporarily held by the buffer part, to which the first and second transfer units are accessible, the first and second transfer units can carry out other operations while the aligned object is temporarily held. Therefore, it is possible to enhance the utilizing efficiencies of the first and second transfer units.

The buffer part may have at least one of a preheating unit for preheating the object and a cooling unit for cooling the object. Thus, the preheating and cooling of the object can be carried out without decreasing the transfer efficiency of the object.

Preferably, the at least one of the preheating unit and the cooling unit airtightly separates the object from the transfer chamber during preheating or cooling. Thus, it is possible to prevent a gas, which has been released or exhausted from the surface of the object during preheating, and a cooling gas, which has been used for cooling, from being leaked into the transfer chamber.

The at least one of the preheating unit and the cooling unit may comprise: a closing lid capable of supporting thereon the object; a container having an opening corresponding to the closing lid; and a lift unit for vertically moving the closing lid with respect to the container, wherein when the closing lid moves upwards or downwards, the container is associated with the closing lid to airtightly separate the object from the transfer chamber.

Preferably, the process system further comprises: an additional process chamber; and an additional aligning unit, wherein each of said process chambers is provided so as to correspond to one of said aligning units. Thus, since each object-transferring route between the process chamber and the aligning unit is fixed, the aligning errors of the aligning units are not accumulated, so that it is possible to improve the final aligning precision for the object.

The predetermined process may be a process carried out under a reduced pressure atmosphere, and the interior of the transfer chamber may be maintained in a reduced pressure atmosphere.

According to another aspect of the present invention, a process system comprises: a housing chamber for housing therein an object to be processed; a process chamber for carrying out a predetermined process for the object; a transfer chamber for establishing a communication between the housing chamber and the process chamber; a first transfer unit for delivering the object between the transfer chamber and the housing chamber; a second transfer unit for delivering the object between the transfer chamber and the process chamber; an aligning unit for aligning the object; and a buffer part for temporarily holding the object, wherein the aligning unit and the buffer part are arranged in an overlapping range of transfer ranges of the first and second transfer units, the buffer part having at least one of a preheating unit for preheating the object and a cooling unit for cooling the object.

Thus, since the aligning unit is arranged in a transfer range common to the first and second transfer units, the second transfer unit can take the aligned object after the object is mounted on the aligning unit by the first transfer unit. Therefore, immediately after the first transfer unit mounts the object on the aligning unit, the first transfer unit can move to carry out the transfer operation of another object without standing by until the aligning operation is completed. As a result, it is possible to efficiently transfer the object, so that it is possible to improve the throughput in the process.

In addition, since the aligned object can be temporarily held by the buffer part, to which the first and second transfer units are accessible, the first and second transfer units can carry out other operations while the aligned object is temporarily held. Therefore, it is possible to enhance the utilizing efficiencies of the first and second transfer units. Moreover, the preheating and cooling of the object can be carried out without decreasing the transfer efficiency of the object.

Also in this case, the at least one of the preheating unit and the cooling unit may comprise: a closing lid capable of supporting thereon the object; a container having an opening corresponding to the closing lid; and a lift unit for vertically moving the closing lid with respect to the container, wherein when the closing lid moves upwards or downwards, the container is associated with the closing lid to airtightly separate the object from the transfer chamber.

In addition, the preheating unit and the cooling unit may be provided in the buffer part so as to face each other in substantially vertical directions.

According to a further aspect of the present invention, a process system comprises: a housing chamber for housing therein an object to be processed; a first transfer chamber connected to the housing chamber so as to be capable of being open and closed; a first transfer unit, provided in the first transfer chamber, for delivering the object between the first transfer chamber and the housing chamber; a process chamber for carrying out a predetermined process for the object; a second transfer chamber connected to the process chamber so as to be capable of being open and closed; a second transfer unit, provided in the second transfer chamber, for delivering the object between the second transfer chamber and the process chamber; a load-lock chamber provided between the first transfer chamber and the second transfer chamber, the load-lock chamber being capable of being evacuated; and an aligning unit, provided in the load-lock chamber, for aligning the object, wherein the aligning unit is arranged in an overlapping range of transfer ranges of the first and second transfer units.

In this case, since the aligning unit is arranged in the conventionally provided load-lock chamber, it is possible to improve the transfer efficiency of the object.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1b is a partially enlarged view for explaining a transfer range of a transfer unit in the process system shown in FIG. 1a;

FIG. 2 is a longitudinal section showing a buffer part having a preheating unit and a cooling unit in the process system shown in FIG. 1a;

FIG. 6 is a horizontal section showing a modified example of the preferred embodiment shown in FIG. 1a;

FIG. 7 is a horizontal section showing another modified example of the preferred embodiment shown in FIG. 1a.

DESCRIPTION OF THE PREFERRED EMBODIMENTS

Referring now to the accompanying drawings, a preferred embodiment of a process system with a transfer unit for an object to be processed, according to the present invention, will be described in detail below.

Figure 1A:
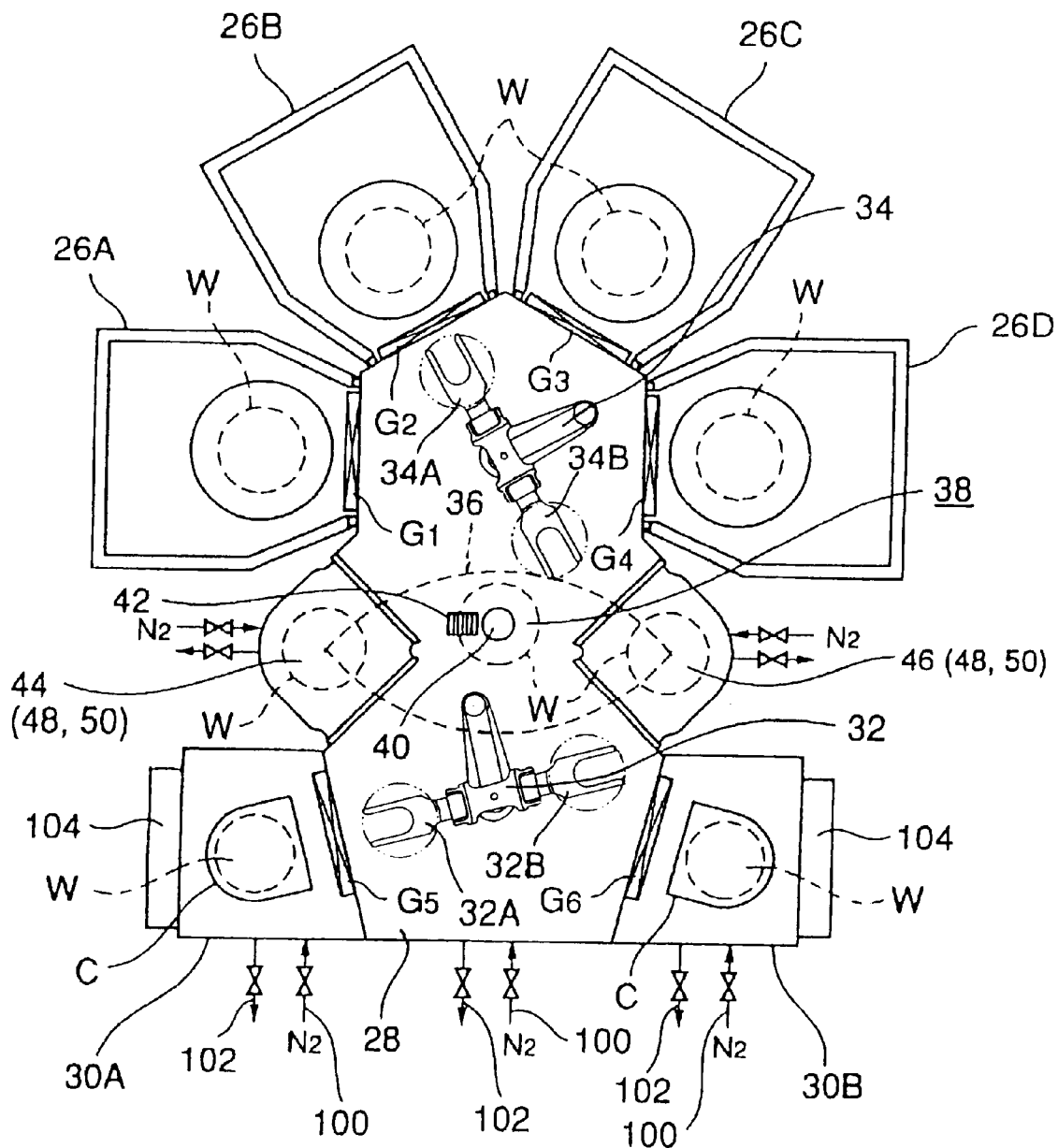
FIG. 1a is a horizontal section schematically showing a preferred embodiment of a process system with a transfer unit for an object to be processed, according to the present invention.

A process system shown in FIG. 1a comprises four process chambers 26A, 26B, 26C and 26D, an elongated transfer chamber 28, and two cassette housing chambers 30A and 30B. Specifically, one side of the transfer chamber 28 is polygonal, the sides of which are connected to the process chambers 26A through 26D, and the other side of the transfer chamber 28 is connected to the cassette housing chambers 30A and 30B. The process chambers 26A through 26D and the cassette housing chambers 30A and 30B are connected to the transfer chamber 28 via gate valves G1 through G4, G5 and G6 capable of being airtightly open and closed, and clustered, respectively, to be capable of being communicated with the transfer chamber 28 if necessary.

In the four process chambers 26A through 26D, the same kind or different kinds of processes are carried out for semiconductor wafers W serving as objects to be processed. In the transfer chamber 28, a first transfer unit 32 comprising an articulated arm capable of bending, stretching and rotating is provided at a position, at which the first transfer unit 32 is accessible to the cassette housing chambers 30A and 30B. The first transfer unit 32 has two holding forks 32A and 32B capable of bending and stretching in opposite directions to each other to handle two wafers at a time.

On the opposite side in the transfer chamber 28, a second transfer unit 34 having the same construction as that of the first transfer unit 32 is provided at a position, at which the second transfer unit 34 is accessible to the four process chambers 26A through 26D. The second transfer unit 34 also has two holding forks 34A and 34B capable of bending and stretching in opposite directions to each other to handle two wafers at a time. Each of the first and second transfer units 32 and 34 may have only one holding fork.

Figure 1B:
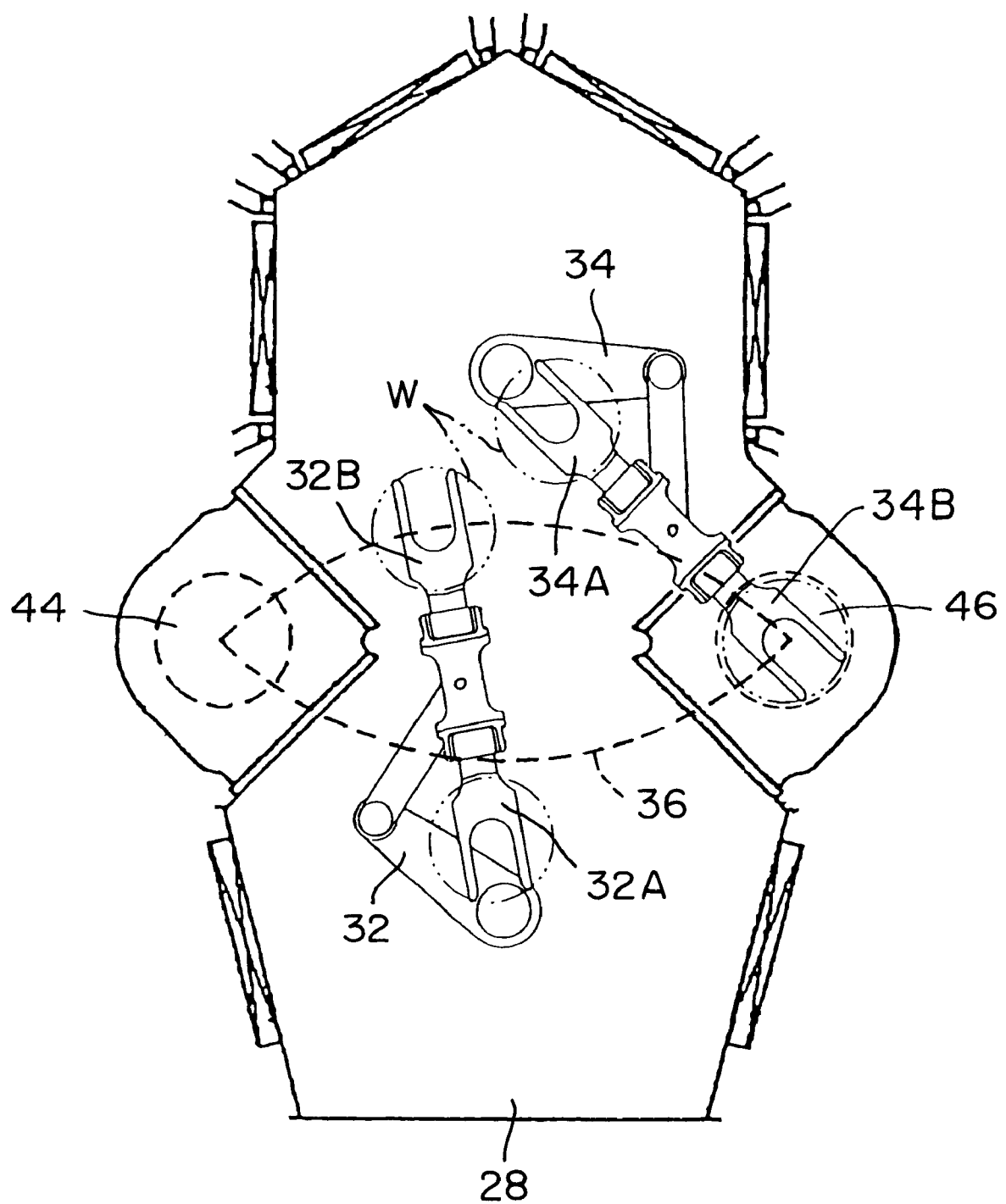

In the overlapping range 36 (see FIG. 1b) of the transfer ranges of the first and second transfer units 32 and 34, specifically at a substantially intermediate position between the transfer units 32 and 34, an aligning unit 38 is provided. The aligning unit 38 detects the orientation flat or notch of the semiconductor wafer W to align the wafer W.

Specifically, the aligning unit 38 has a turntable 40 for holding and rotating the wafer W, and an optical sensor 42 for optically detecting the orientation flat or notch of the wafer W. Therefore, both of the first and second transfer units 32 and 34 are accessible to the wafer W mounted on the turntable 40 of the aligning unit 38.

In the above described overlapping range 36 of the transfer ranges, first and second buffer parts 44 and 46 for temporarily holding the wafer W are provided so as to correspond to both sides of the aligning unit 38. Also as shown in FIGS. 2 through 5, each of the buffer parts 44 and 46 has a preheating unit 48 for preheating the wafer W, and a cooling unit 50 for cooling the wafer W. Furthermore, since the first and second buffer parts 44 and 46 have the same construction, one buffer part 44 will be described below as an example.

Figure 2:
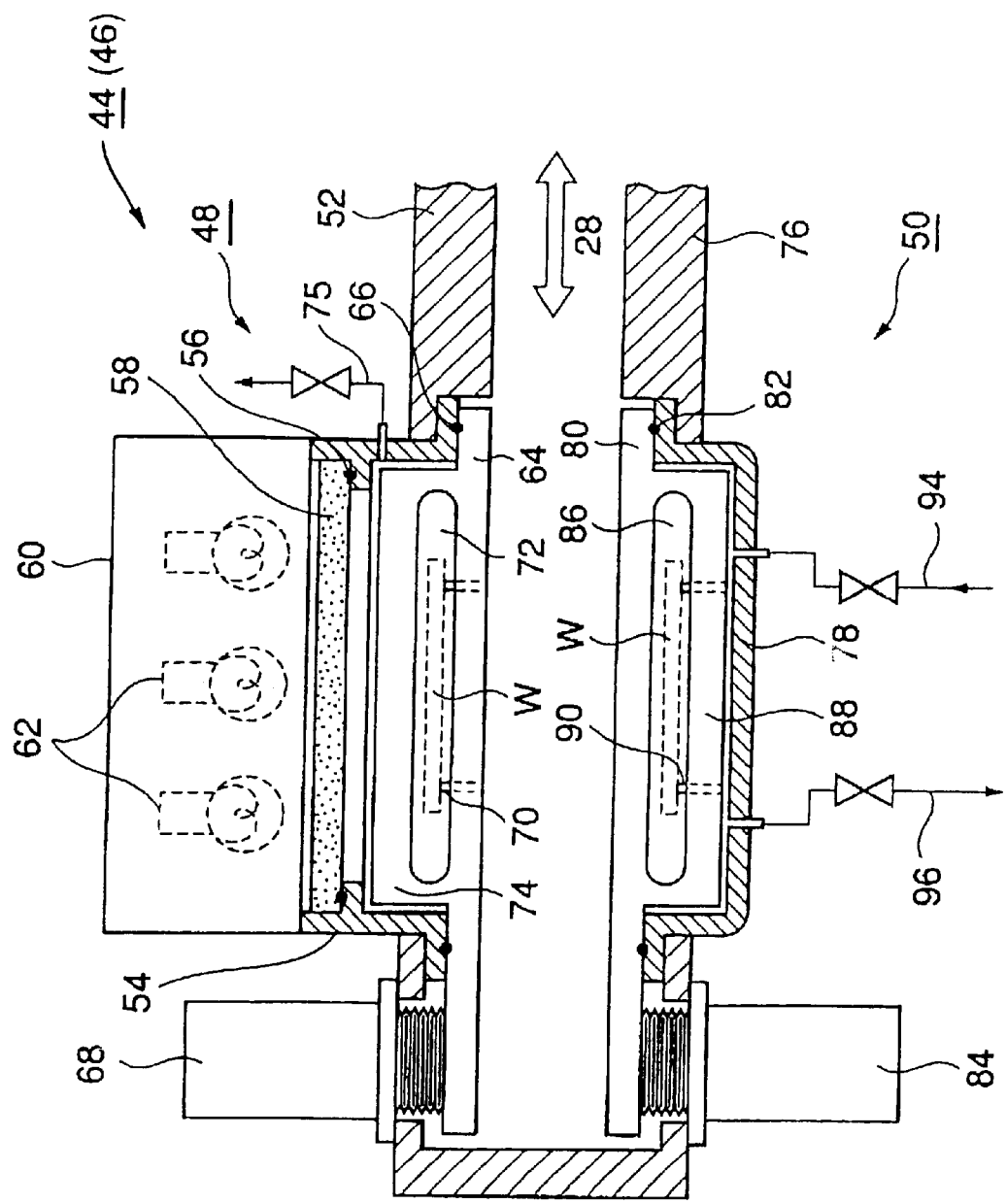
Figure 4:
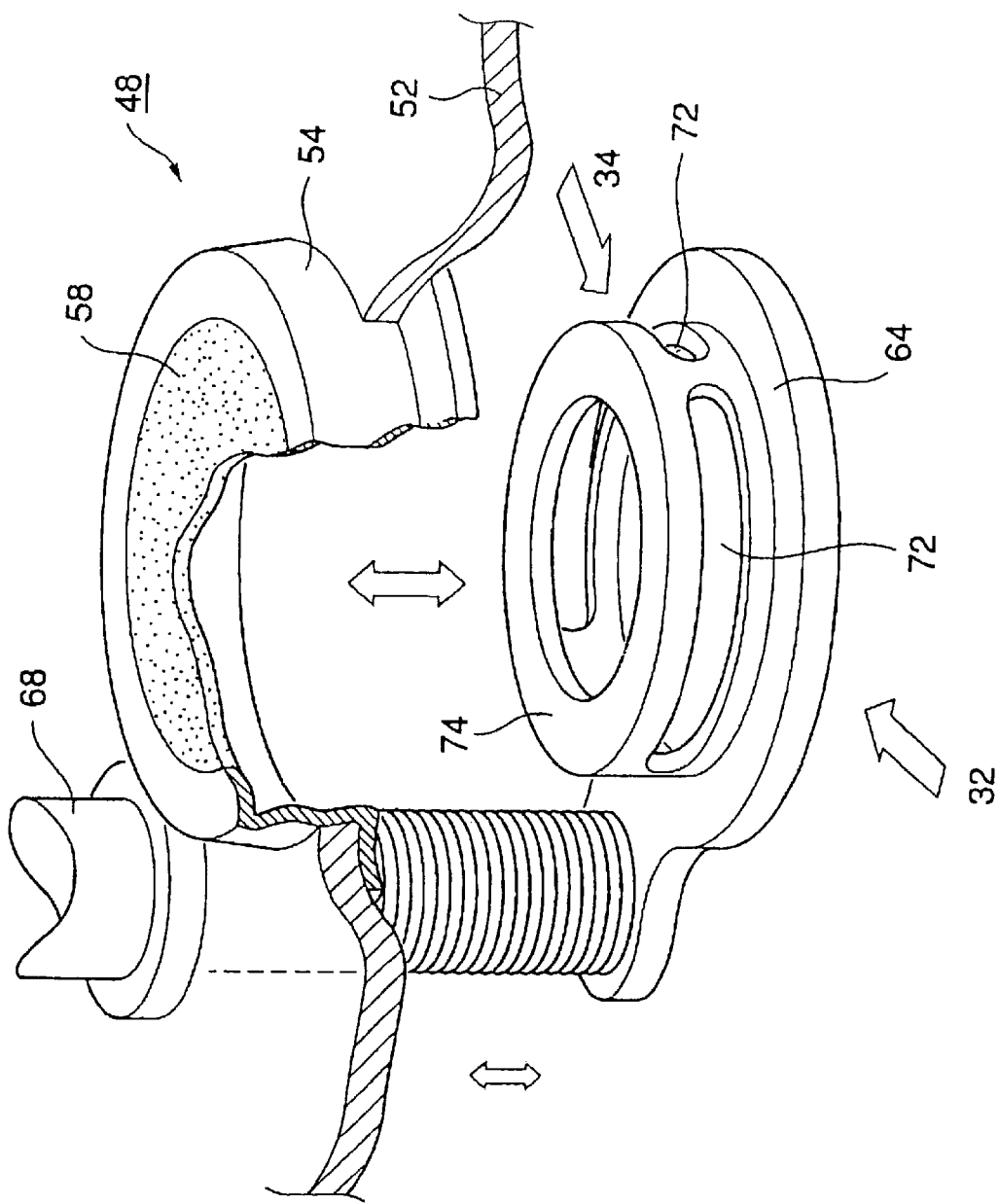
FIG. 4 is a perspective view showing a part of the preheating unit of the buffer part shown in FIG. 2.

The buffer part 44 is designed to be usually communicated with the transfer chamber 28 and to airtightly separate a space for housing therein the wafer W from the transfer chamber 28 during the preheating or cooling of the wafer. Specifically, as shown in FIGS. 2 and 4, the preheating unit 48 has a top protruding container 54, which protrudes upwards from a top partition wall 52 of the buffer part 44 to be airtightly mounted thereon. The lower end of the top protruding container 54 passes through the top partition wall 52 to be open downwards. The roof portion of the top protruding container 54 is open, to which a transparent window 58 of quartz or the like is airtightly connected via a sealing member 56, such as an O-ring. Above the transparent window 58, a casing 60 is provided. In the casing 60, a plurality of heating lamps 62 are provided. The casing 60 and the heating lamps 62 are omitted from FIG. 4.

In addition, a top closing lid 64 is provided so as to correspond to the lower end opening of the top protruding container 54. The top closing lid 64 is overhung-supported on a top air cylinder (lift unit) 68, which is fixed on the top partition wall 52, to be vertically movable with respect to the top protruding container 54. As shown in FIG. 2, when the top closing lid 64 moves upwards, the top closing lid 64 airtightly closes the lower end opening of the top protruding container 54 via a sealing member 66, such as an O-ring, to close the container 54. In addition, a plurality of supporting pins, e.g., three supporting pins 70 (only two pins are shown in the figure), project from the upper surface of the top closing lid 64 so as to be capable of supporting the wafer W thereon.

In order to reduce the airtight space, a reinforcing member 74 having an open roof portion and two laterally-elongated transfer ports 72, 72 (see FIG. 4) on the side wall is provided on the top closing lid 64. The wafer W is capable of being introduced or carried out via the two transfer ports 72, 72 in two directions. If the airtight space is reduced, there is an advantage in that it is possible to reduce a gas exhausting time to reduce a heating time. In addition, a first exhaust system 75 (see FIG. 2) connected to a vacuum pump (not shown) or the like is connected to the side wall of the top protruding container 54 so as to be capable of exhausting gas which is discharged from the surface of the wafer during the heating of the wafer.

Figure 5:
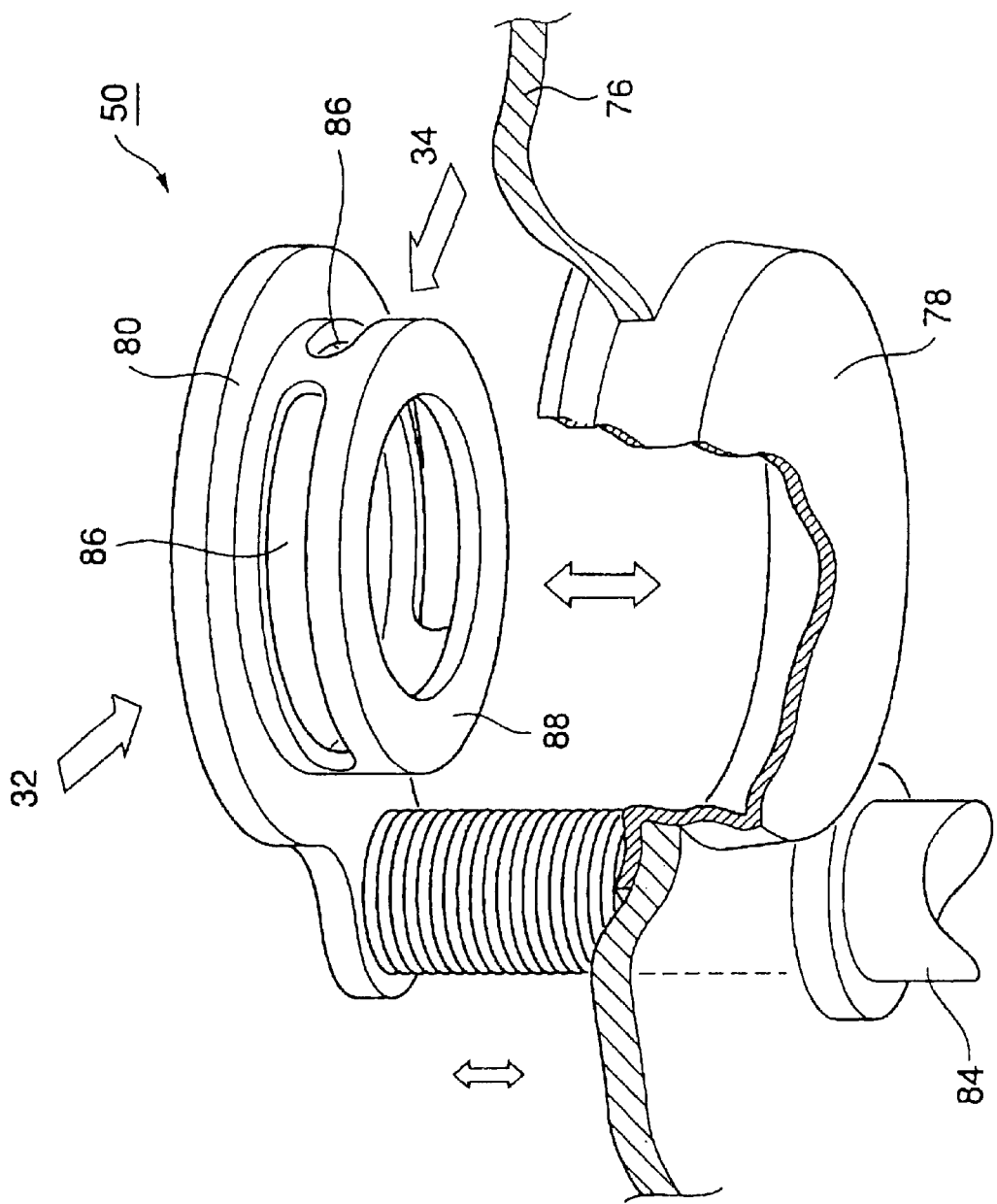
FIG. 5 is a perspective view showing a part of the cooling unit of the buffer part shown in FIG. 2.

On the other hand, as shown in FIGS. 2 and 5, the cooling unit 50 has a bottom protruding container 78, which protrudes downwards from a lower partition wall 76 of the buffer part 44 to be airtightly mounted thereon. The upper end of the bottom protruding container 78 passes through the lower partition wall 76 to be open upwards. A bottom closing lid 80 is provided so as to correspond to the upper end opening of the bottom protruding container 78. The bottom closing lid 80 is overhung-supported on a bottom air cylinder (lift unit) 84, which is fixed on the bottom partition wall 76, to be vertically movable with respect to the bottom protruding container 78. As shown in FIG. 2, when the bottom closing lid 80 moves downwards, the bottom closing lid 80 airtightly closes the upper end opening of the bottom protruding container 78 via a sealing member 82, such as an O-ring, to close the container 78. In addition, a plurality of supporting pins, e.g., three supporting pins 90 (only two pins are shown in the figure), project from the upper surface of the bottom of the bottom closing lid 78 so as to be capable of supporting the wafer W thereon.

In order to reduce the airtight space, a reinforcing member 88 having two laterally-elongated transfer ports 86, 86 (see FIG. 5) on the side wall is provided on the lower portion of the bottom closing lid 80. The wafer W is capable of being introduced or carried out via the two transfer ports 86, 86 in two directions. Furthermore, if the airtight space is reduced, there is an advantage in that it is possible to reduce a gas exhausting time to reduce a cooling time. In addition, a cooling gas system 94 for selectively introducing a cooling gas, such as a cooled $N_2$ gas, and a second exhaust system 96 connected to a vacuum pump (not shown) or the like, are connected to the bottom of the bottom protruding container 78. By the cooling gas system 94 and the second exhaust system 96, it is possible to introduce a cooling gas and discharge the introduced cooling gas during the cooling of the wafer.

The above described preheating unit 48 and cooling unit 50 have been provided so as to face each other in vertical directions. While the preheating unit 48 has been positioned above the cooling unit 50, the preheating unit 48 may be positioned beneath the cooling unit 50.

In addition, the above described transfer chamber 28 and cassette housing chambers 30A and 30B are provided with a system 100 for supplying an inert gas, e.g., $N_2$ gas, and a vacuum exhaust system 102 (see FIG. 1).

With this construction, the operation and the function of the process system in this preferred embodiment will be described below.

The process system in this preferred embodiment is characterized in that while a semiconductor wafer W is aligned by the aligning unit 38, another semiconductor wafer is transferred by the first transfer unit 32 without causing the first transfer unit 32 to stand by, so that the throughput in the process is improved.

First, the cassette C housing therein a plurality of unprocessed semiconductor wafers W, e.g., 25 unprocessed semiconductor wafers W, is introduced into each cassette housing chamber, e.g., the cassette housing chamber 30A, via a gate door 104. This cassette housing chamber 30A has been evacuated to a vacuum state. Then, the first transfer unit 32 in the transfer chamber 28, which has been previously held in a vacuum state, is driven to take out an unprocessed wafer W from the cassette C in the first cassette chamber 30A via the open gate valve G5. By the first transfer unit 32, the taken wafer W is introduced into the transfer chamber 28 to be mounted on the turntable 40 of the aligning unit 38.

Then, by detecting the orientation flat or notch of the wafer W by means of the optical sensor 42 while rotating the turntable 40, the wafer W is aligned. The time required to carry out the alignment is, e.g., about 10 to 20 seconds. In the case of the conventional system, the transfer unit is stopped and stands by during the alignment operation. However, in the case of the process system in this preferred embodiment, immediately after the first transfer unit 32 mounts the wafer W on the turntable 40, the first transfer unit 32 moves toward the first cassette housing chamber 30A to hold a new unprocessed wafer W. That is, the alignment operation by the aligning unit 38 and the transfer operation by the first transfer unit 32 are carried out simultaneously in parallel.

Then, after the alignment of the wafer W by the aligning unit 38 is completed, the wafer W is held by the second transfer unit 34, and transferred to any one of the buffer parts, e.g., the buffer part 44, if preheating is required. If no preheating is required, the wafer W is transferred directly to the process chamber. At this time, immediately after the aligned wafer W is held by the second transfer unit 34, an unprocessed wafer W is mounted on the turntable 40 of the aligning unit 38 by the first transfer unit 32 having transferred the unprocessed wafer W. As described above, the transfer of the wafer W is rapidly carried out, so that the throughput in the process can be improved.

Figure 3:
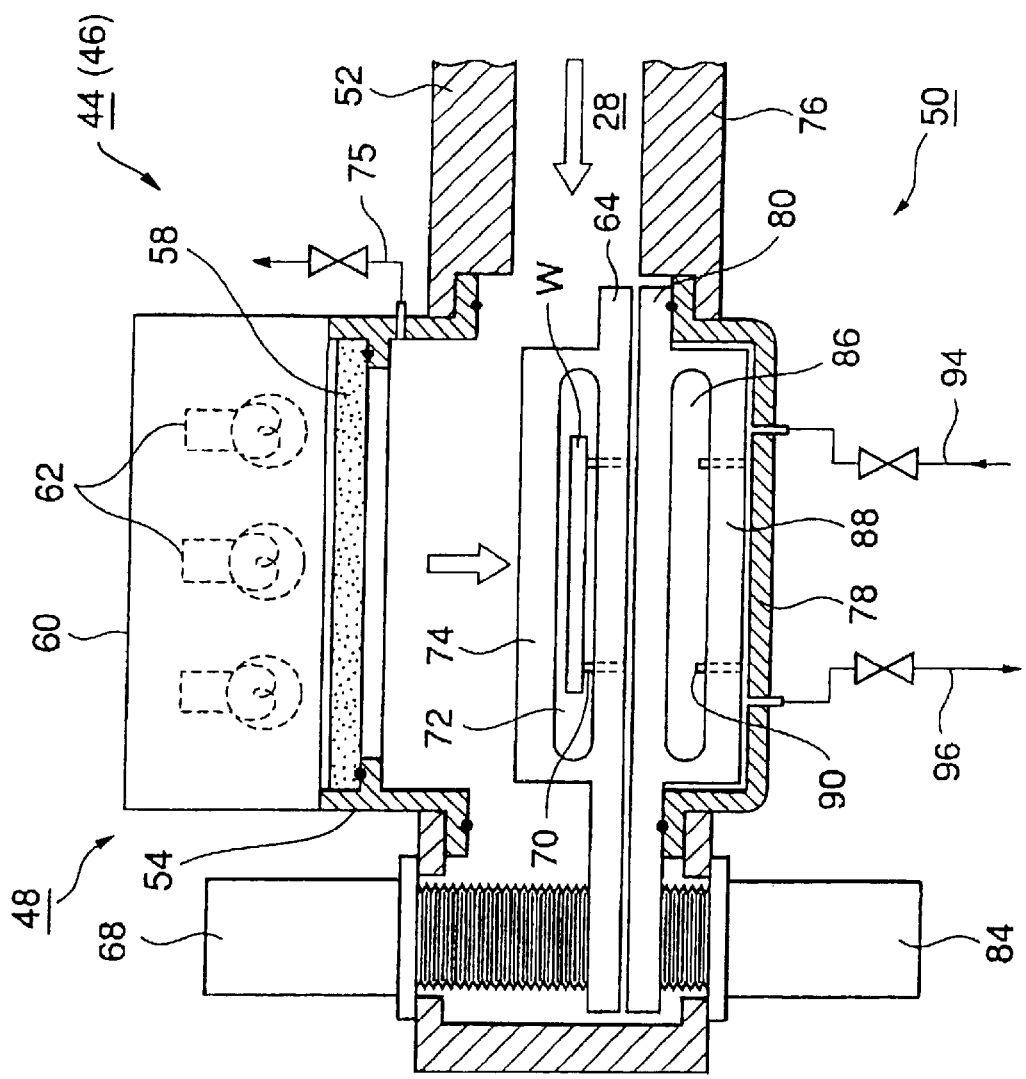
FIG. 3 is a longitudinal section showing the operation of the buffer part shown in FIG. 2.

On the other hand, when the wafer is preheated in the buffer part 44, the top closing lid 64 is moved downwards to use the preheating unit 48 as shown in FIG. 3. Then, the second transfer unit 34 is elongated to introduce the wafer W into the top closing lid 64 via the transfer port 72. Then, the top air cylinder 68 is driven to minutely move the top closing lid 64 upwards to support the wafer W on the supporting pins 70, so that the wafer W is delivered. Then, the second transfer unit 34 is bent to be retracted from the first buffer 44. Thereafter, the top air cylinder 68 is further driven to move the top closing lid 64 to the upper limit to close the lower end opening of the top protruding container 54 by the top closing lid 64 as shown in FIG. 2 to close the top protruding container 54.

Then, in this state, if the heating lamps 62 is turned on, the light energy thereof passes through the transparent window 58 to irradiate the surface of the wafer W to preheat the wafer W to a predetermined temperature. Although an activated gas is exhausted from the surface of the wafer W by the preheating, this gas does not flow into the transfer chamber 28 since it is exhausted from the evacuated first exhaust system 75 to the outside of the system. The time required to carry out the preheating is, e.g., about 30 to 40 seconds.

If the preheating is completed as described above, the top closing lid 64 is moved downwards again as shown in FIG. 3. In this state, the second transfer unit 34 is driven to transfer the preheated wafer W to a predetermined process chamber, e.g., the process chamber 26A, to carry out a predetermined process, e.g., a process for depositing a metal film or insulating film. The time required to carry out this process is, e.g., about 60 to 90 seconds, although it depends on the contents of process. Thereafter, if a plurality of processes are carried out for a single wafer W, the second transfer unit 34 transfers the wafer W between the process chambers 26B through 26D.

Thus, if all of required processes are completed, the wafer W is transferred along the reverse route of the above described route. The completely processed wafer W is in a high temperature state of, e.g., about 600° C., although it depends on the contents of process. Therefore, in order to cool the wafer W by the cooling unit 50, the wafer W is transferred to any one of the buffer parts, e.g., the buffer part 44, by the second transfer unit 34. In this case, unlike the above described preheating, the bottom air cylinder 84 is driven to move the bottom closing lid 80 upwards in FIG. 2 to deliver the wafer W in the high temperature state onto the supporting pins 90. Then, if the delivery of the wafer W is completed, the bottom air cylinder 84 is driven again to move the bottom closing lid 80 to the lower limit to close the bottom protruding container 78. Then, the cooling gas is introduced into the closed bottom protruding container 78 from the cooling gas system 94 to cool the wafer W, and simultaneously, the cooling gas is exhausted to the outside of the system via the second exhaust system 96. The time required to carry out the cooling is, e.g., about 30 to 40 seconds.

As described above, if the cooling of the wafer W is completed, the cooled wafer W is held by the first transfer unit 32 to be introduced into the cassette C in the first or second cassette housing chamber 30A or 30B which has been previously evacuated to a vacuum state. If necessary, after the wafer W is aligned by the aligning unit 38 again, the wafer W is immediately transferred into the cassette C. If the aligned wafer W is immediately transferred to the process chamber without the preheating of the wafer W, it is possible to save trouble to transfer the wafer to the buffer part. Therefore, it is possible to improve the throughput by the decreased number of transfer operations, and it is possible to improve the wafer aligning precision in the process chamber.

While a simple example of the transfer route for the wafer W has been only described to facilitate better understanding thereof, the wafer in the transfer chamber 28 is actually transferred along two routes using the two buffer parts 44 and 46.

In addition, since the aligning unit 38 and the buffer parts 44 and 46 are arranged in the overlapping range 36 of the transfer ranges of the first and second transfer units 32 and 34, the transfer of the wafer between the aligning unit 38 and the buffer parts 44 and 46 is actually efficiently carried out using an empty transfer unit of the first and second transfer units 32 and 34. Therefore, it is possible to improve the throughput in the process since the wafer is efficiently transferred.

While the wafer has been preheated or cooled, the wafer may be delivered from one transfer unit to the other transfer unit via only the aligning unit 38 without the need of the buffer parts 44 and 46 if the preheating and cooling operations are not required. Therefore, the number of delivery operations for the wafer is small, so that it is possible to reduce aligning errors.

Moreover, there are some cases where the processes carried out in the process chambers 26A through 26D are not carried out under a vacuum atmosphere in the case of an oxidation or diffusion process. In such cases, it is not required to maintain the interior of the transfer chamber 28 in a vacuum state, and it has only to maintain the interior of the transfer chamber 28 at a pressure of about atmospheric pressure by inert $N_2$ gas or the like.

Figure 6:
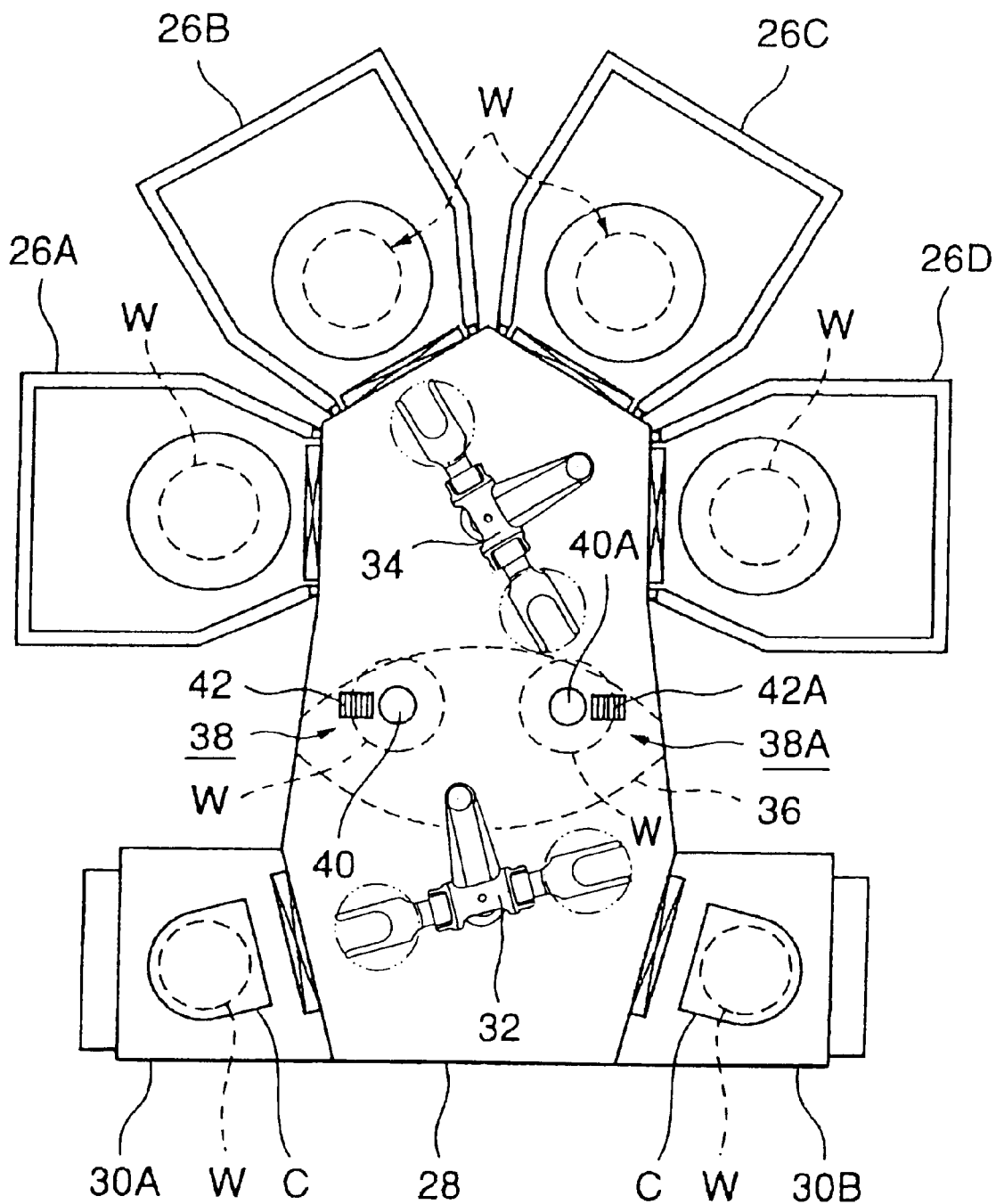

While the one aligning unit 38 and the two buffer parts 44 and 46 having the functions of the preheating unit 48 and cooling unit 50 have been provided in the above described preferred embodiment, a plurality of aligning units 38, e.g., two aligning units 38, may be provided while or without providing the buffer parts 44 and 46. FIG. 6 shows a modified example of such a process system.

In the process system shown in FIG. 6, the above described two buffer parts 44 and 46 are omitted, and one aligning unit is added to provide two aligning units 38 and 38A. The aligning units 38 and 38A have turntables 40 and 40A, and optical sensors 42 and 42A, respectively. The two aligning units 38 and 38A are provided in parallel in the overlapping range 36 of the transfer ranges of the first and second transfer units 32 and 34, so that the transfer units 32 and 34 are accessible to the aligning units 38 and 38A, respectively.

Also in this case, immediately after the first transfer unit 32 mounts an unprocessed wafer W, which is taken out from the cassette housing chamber 30A or 30B, on any one of the aligning units 38 and 38A, the first transfer unit 32 moves toward the cassette housing chamber 30A or 30B for transferring the next unprocessed wafer W without waiting for the completion of the aligning operation. Therefore, similar to the above described preferred embodiment, it is possible to enhance the wafer transfer efficiency to improve the throughput in the process.

In place of the above described operation, the process chambers 26A through 26D may be used so as to correspond to one of the aligning units 38 and 38A. For example, the wafer processed in the process chambers 26A and 26B may pass through one aligning unit 38 on both ways, and the wafer processed in the process chambers 26C and 26D may pass through the other aligning unit 38A on both ways. In this case, since the transfer route of each wafer W is fixed to be the same route on both ways, the aligning errors of two aligning units 38 and 38A are not accumulated, so that it is possible to further improve aligning precision.

Figure 7:
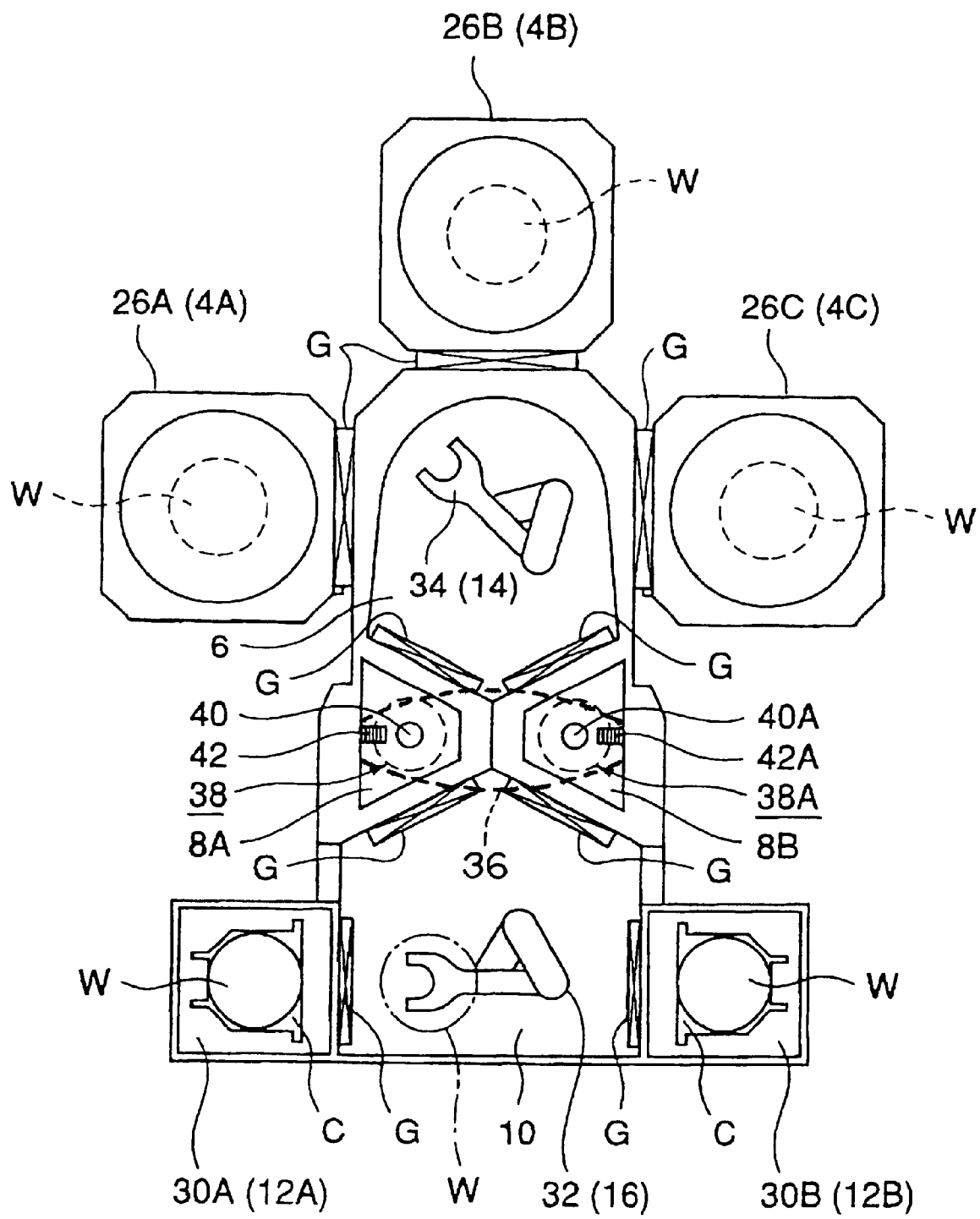

While the first and second transfer units 32 and 34 and the aligning unit 38 (38A) have been provided in one large transfer chamber 28 in the above described preferred embodiment, the present invention should be limited thereto. For example, an aligning unit may be arranged in each of the load-lock chambers 8A and 8B of the conventional process system shown in FIG. 8. FIG. 7 shows such a process system.

Figure 8:
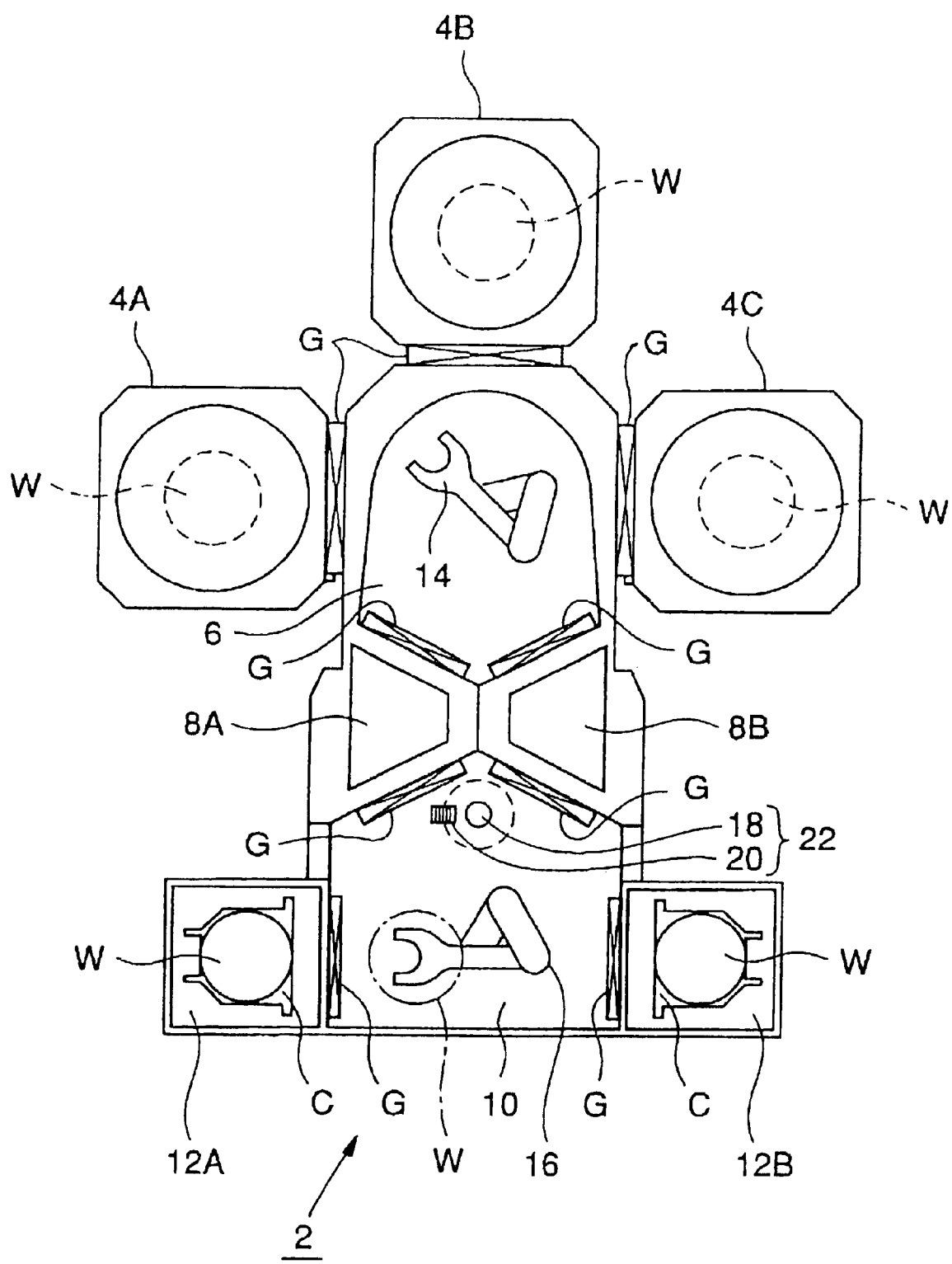
FIG. 8 is a horizontal section showing an example of a conventional clustered-process-system.

In the conventional process system shown in FIG. 8, the aligning unit 22 is provided in the first transfer chamber 10 which is maintained, e.g., at atmospheric pressure in an atmosphere of $N_2$, whereas in the modified example shown in FIG. 7, aligning units 38 and 38A are provided in the load-lock chambers 8A and 8B, respectively, in place of the aligning unit 22. The reference numbers of the conventional system shown in FIG. 8 are also shown in FIG. 7.

That is, in this modified example, a first transfer unit 32 (16) is provided in the first transfer chamber 10 which is maintained, e.g., at atmospheric pressure in an atmosphere of $N_2$, and a second transfer unit 34 (14) is provided in the second transfer chamber 6 which is maintained in a vacuum state. The load-lock chambers 8A and 8B capable of being evacuated are provided at positions, to which the first and second transfer units 32 and 34 are accessible. In the load-lock chambers 8A and 8B, the aligning units 38 and 38A having turntables 40 and 40A and optical sensors 42 and 42A are provided, respectively.

Also in the case of this modified example, the two aligning units 38 and 38A are arranged at positions, to which the first and second transfer units 32 and 34 are accessible, i.e., in the overlapping range 36 of the transfer ranges of the transfer units 32 and 34. Therefore, the process system in this modified example has the same operation and effects as those of the process system shown in FIG. 6, so that it is possible to enhance the transfer efficiency to improve the throughput in the process. While each of the first and second transfer units 32 and 34 shown in FIG. 7 has been a single transfer type unit having a single holding fork, it may be a double transfer type unit having two holding forks 32A and 32B shown in FIG. 1.

While the semiconductor wafer has been used as an example of an object to be processed, the present invention should not be limited thereto, but the invention may be applied to LCD substrates, glass substrates and so forth.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A process system comprising:

a housing chamber for housing therein an object to be processed;

a process chamber for carrying out a predetermined process for said object;

a transfer chamber for establishing a communication between said housing chamber and said process chamber, a first transfer unit for delivering said object between said transfer chamber and said housing chamber;

a second transfer unit for delivering said object between said transfer chamber and said process chamber;

a buffer part for temporarily holding said object;

a protruding container protruding vertically from said buffer part;

a closing lid for air-tightly separating said protruding container from said transfer chamber; and a lift unit for vertically moving said closing lid with respect to said container, wherein said closing lid has a support for supporting thereon said object and a structural member surrounding said support so as to reduce an air-tight space in said container closed by said lid.

2. A process system as set forth in claim 1, wherein said buffer part is provided in an overlapping range of transfer ranges of said first transfer unit and said second transfer unit.

3. A process system as set forth in claim 1, wherein there is provided at least one of a preheating unit for preheating said object in said protruding container, and a cooling unit for cooling said object in said protruding container.

4. A process system as set forth in claim 1, further comprising an aligning unit arranged in an overlapping range of transfer ranges of said first transfer unit and said second transfer unit.

5. A process system as set forth in claim 4, further comprising:

an additional process chamber; and an additional aligning unit, wherein each of said process chambers is provided so as to correspond to one of said aligning units.

6. A process system as set forth in claim 1, further comprising a system for introducing an inert gas into said housing chamber, said transfer chamber, and said buffer part.

* * * * *